(12) United States Patent
Qian

(10) Patent No.: US 9,947,891 B2
(45) Date of Patent: Apr. 17, 2018

(54) OLED PACKAGING METHOD AND OLED PACKAGING STRUCTURE

(71) Applicant: Shenzhen China Star Optoelectronics Technology Co., Ltd., Shenzhen (CN)

(72) Inventor: Jiajia Qian, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 165 days.

(21) Appl. No.: 14/758,806

(22) PCT Filed: Apr. 3, 2015

(86) PCT No.: PCT/CN2015/075847
§ 371 (c)(1),
(2) Date: Jul. 1, 2015

(87) PCT Pub. No.: WO2016/123857
PCT Pub. Date: Aug. 11, 2016

(65) Prior Publication Data
US 2016/0315282 A1 Oct. 27, 2016

(30) Foreign Application Priority Data
Feb. 6, 2015 (CN) ............ 2015 1 0065302

(51) Int. Cl.
*H01L 21/00* (2006.01)
*H01L 51/52* (2006.01)
(Continued)

(52) U.S. Cl.
CPC ...... *H01L 51/5246* (2013.01); *H01L 51/0008* (2013.01); *H01L 51/524* (2013.01);
(Continued)

(58) Field of Classification Search
CPC .................................................. H01L 51/5246
(Continued)

(56) References Cited

U.S. PATENT DOCUMENTS

2004/0091741 A1* 5/2004 Lin .................. H05B 33/04
428/690
2005/0155704 A1* 7/2005 Yokajty ............. H01L 51/5259
156/295
(Continued)

FOREIGN PATENT DOCUMENTS

CN 104037363 A 9/2014
JP 200810299 A 1/2008

*Primary Examiner* — Ajay K Arora
(74) *Attorney, Agent, or Firm* — Leong C. Lei

(57) ABSTRACT

The present invention provides an OLED packaging method and an OLED packaging structure. The OLED packaging method includes the following steps: providing a TFT substrate (1) and a package lid (2); forming air channels (21) on the package lid (2); forming an OLED device (11) on the TFT substrate (1); coating a loop of desiccant (12) on the TFT substrate (1) along an outer circumference of the OLED device (11) and coating a loop of a dam (13) along an outer circumference of the desiccant (12); laminating the TFT substrate (1) and the package lid (2) together; and pressing the TFT substrate (1) and the package lid (2) together and applying irradiation of ultraviolet light to cure the dam (13). The method effectively eliminates the issue of resin flushing caused by a difference of air pressures inside and outside the packaging structure in bonding the package lid and the TFT substrate so as to improve the property of water resistance, enhance mechanical strength of the packaging structure, and improve packaging effectiveness.

11 Claims, 4 Drawing Sheets

(51) Int. Cl.
  *H01L 51/56* (2006.01)
  *H01L 51/00* (2006.01)
  *H01L 27/32* (2006.01)
(52) U.S. Cl.
  CPC .......... *H01L 51/56* (2013.01); *H01L 27/3244* (2013.01); *H01L 51/0024* (2013.01); *H01L 51/5243* (2013.01); *H01L 51/5259* (2013.01); *H01L 2227/323* (2013.01)
(58) Field of Classification Search
  USPC ............................................ 257/40; 438/125
  See application file for complete search history.

(56) References Cited

U.S. PATENT DOCUMENTS

| | | | |
|---|---|---|---|
| 2007/0194304 A1* | 8/2007 | Zu | H01L 51/5246 257/40 |
| 2010/0013041 A1* | 1/2010 | Bolt | H01L 27/14618 257/443 |
| 2013/0011598 A1* | 1/2013 | Kawanami | H01J 9/26 428/76 |
| 2014/0167012 A1* | 6/2014 | Sun | H01L 51/5259 257/40 |
| 2016/0254480 A1* | 9/2016 | Yang | H01L 51/5259 257/40 |

* cited by examiner

OLED PACKAGING METHOD AND OLED PACKAGING STRUCTURE

BACKGROUND OF THE INVENTION

1. Field of the Invention

The present invention relates to the field of display technology, and in particular to an organic light emitting diode (OLED) packaging method and an OLED packaging structure.

2. The Related Arts

In the field of display technology, the flat panel display technology, including liquid crystal display (LCD) and organic light emitting diode (OLED), have gradually taken the place of cathode ray tube (CRT) displays. Among them, OLED has various advantages, including natural light, low drive voltage, high emission efficiency, short response time, high sharpness and contrast, approximately 180 degree view angle, wide range of operation temperature, and being capable of achieving flexible displaying and large-area full-color displaying, and is widely used in for example mobile phone screens, computer displays, and full-color televisions and are considered the display device having the most prosperous development.

An OLED comprises, in sequence, an anode formed on a substrate, an organic emissive layer, and a cathode. The primary issue, and also the greatest problem of an OLED, that constrains the progress of the OLED industry is the relatively short lifespan of the OLED. The cause that leads to the relatively short lifespan of the OLED is that electrodes of an OLED device and an organic substance making the light emissive layer are extremely sensitive to moisture and oxygen contained in the atmosphere and electrochemical corrosion may easily caused in an environment containing moisture and oxygen to damage the OLED device. As a consequence, an OLED must be properly packaged to prevent invasion of moisture and oxygen into the interior of the OLED.

Packaging is a link of vital importance in a manufacturing process of an OLED display. The quality of the packaging directly affects the sealing performance of the OLED display, which in turn affects the lifespan and quality of the OLED. Conventionally, the primary solution taken for an OLED display is the so called "dam and desiccant" process. As shown in FIG. 1, an OLED packaging structure, which adopts the "dam and desiccant" solution, generally comprises a thin-film transistor (TFT) substrate 100, a package lid 200 opposite to the TFT substrate 100, an OLED device 110 that is located between the TFT substrate 100 and the package lid 200 and mounted to the TFT substrate 100, a loop of desiccant 120 arranged outside and around the OLED device 110, and a loop of a dam 130 arranged outboard the desiccant 120 and bonded to both the TFT substrate 100 and the package lid 200. A process of manufacturing the above packaging structure is to coat the loop of desiccant 120 on the package lid 200 at a location corresponding to an outer circumference of the OLED device 110 and the a sealing dam 130 made of for example epoxy resin is applied to bond the TFT substrate 100 and the package lid 200 to each other. Due to a difference of air pressure between the inside and outside of the packaging structure, such a packaging process often cause a drawback of resin being flushed away in bonding the TFT substrate 100 and the package lid 200.

Thus, it is desired to provide an OLED packaging method and an OLED packaging structure that are novel in order to address the above problems.

SUMMARY OF THE INVENTION

An object of the present invention is to provide an organic light emitting diode (OLED) packaging method, which effectively prevents the resin flushing issue caused by a difference of air pressure inside and outside a packaging structure in bonding a package lid and a thin-film transistor (TFT) substrate so as to increase the capability of water blocking of the packaging structure, improve the mechanical strength of the packaging structure, and enhance the packaging effectiveness.

Another object of the present invention is to provide an OLED packaging structure, which effectively prevents the resin flushing issue caused by a difference of air pressure inside and outside the packaging structure in bonding a package lid and a TFT substrate so as to provide an increased capability of water blocking and also achieve improved mechanical strength and enhanced packaging effectiveness.

To achieve the above objects, firstly, the present invention provides an organic light emitting diode (OLED) packaging method, which comprises the following steps:

(1) providing a thin-film transistor (TFT) substrate and a package lid;
(2) forming air channels in two opposite side portions of a surface of the package lid that faces the TFT substrate to extend between and through front and rear end faces of the package lid;
(3) forming an OLED device on the TFT substrate;
(4) coating a loop of desiccant on the TFT substrate along an outer circumference of the OLED device and coating a loop of a dam along an outer circumference of the desiccant;
(5) laminating the TFT substrate and the package lid to each other, wherein the air channels make inside and outside air pressure consistent; and
(6) pressing the TFT substrate and the package lid together and applying irradiation of ultraviolet light to cure the dam and thus, completing the packaging of the OLED device.

The air channels formed in Step (2) have a cross-section in the form of a corrugated configuration.

Step (2) uses an acidic corrosion process to form the air channels.

Step (3) uses a vapor deposition process to form the OLED device.

In Step (4), the desiccant comprises liquid desiccant.

In Step (6), when the substrate and the package lid are pressed together, the desiccant has a height that is smaller than or equal to a height of the dam.

The air channels are located in areas that are outside an area corresponding to the OLED device.

The present invention also provides an organic light emitting diode (OLED) packaging structure, which comprises: a thin-film transistor (TFT) substrate, a package lid opposite to the TFT substrate, an OLED device arranged between the TFT substrate and the package lid and mounted to the TFT substrate, a loop of desiccant formed along an outer circumference of the OLED device, and a loop of a dam formed along an outer circumference of the desiccant and bonding the TFT substrate and the package lid together;

wherein the package lid has a surface that faces the TFT substrate and has opposite side portions each comprising air channels formed therein and extending between and through front and rear end faces of the package lid, the air channels being located in areas that are outside an area corresponding to the OLED device.

The air channels have a cross section in the form of a corrugated configuration.

The desiccant comprises liquid desiccant and the desiccant has a height smaller than or equal to a height of the dam.

The present invention further provides an organic light emitting diode (OLED) packaging structure, which comprises: a thin-film transistor (TFT) substrate, a package lid opposite to the TFT substrate, an OLED device arranged between the TFT substrate and the package lid and mounted to the TFT substrate, a loop of desiccant formed along an outer circumference of the OLED device, and a loop of a dam formed along an outer circumference of the desiccant and bonding the TFT substrate and the package lid together;

wherein the package lid has a surface that faces the TFT substrate and has opposite side portions each comprising air channels formed therein and extending between and through front and rear end faces of the package lid, the air channels being located in areas that are outside an area corresponding to the OLED device;

wherein the air channels have a cross section in the form of a corrugated configuration; and wherein the desiccant comprises liquid desiccant and the desiccant has a height smaller than or equal to a height of the dam.

The efficacy of the present invention is that the present invention provides an OLED packaging method, which is easy to operate and which forms air channels in two side portions of a surface of a package lid that faces a TFT substrate to extend between and through front and rear end faces of the package lid to make inside and outside air pressure consistent with each other in bonding the TFT substrate and the package lid so as to effectively eliminate the issue of resin flushing caused by inconsistency of air pressures of the inside and outside in bonding the package lid and the TFT substrate. Further, after the TFT substrate and the package lid are pressed to bond to each other, a portion of the dam is forced into the air channels to increase the press-to-engage area between the dam and the package lid, enhance the properties of sealing and water resistance, increase the mechanical strength of bonding between the dam and the package lid, and improve the packaging effectiveness. The present invention provides an OLED packaging structure, which comprises air channels formed in two side portions of the surface of the package lid facing the TFT substrate to extend between and through the front and rear end faces of the package lid, so as to effectively eliminate the issue of resin flushing caused by inconsistency between inside and outside air pressures of the packaging structure in bonding the package lid and the TFT substrate to each other thereby providing an improved property of water resistance and also achieving improved mechanical strength and enhanced packaging effectiveness.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
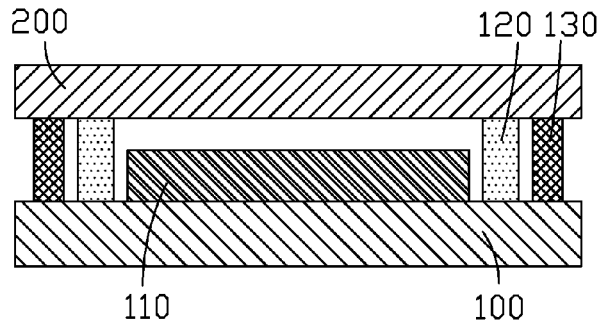
FIG. 1 is a cross-sectional view showing a conventional organic light emitting diode (OLED) packaging structure that adopts the dam and desiccant solution.
Figure 2:
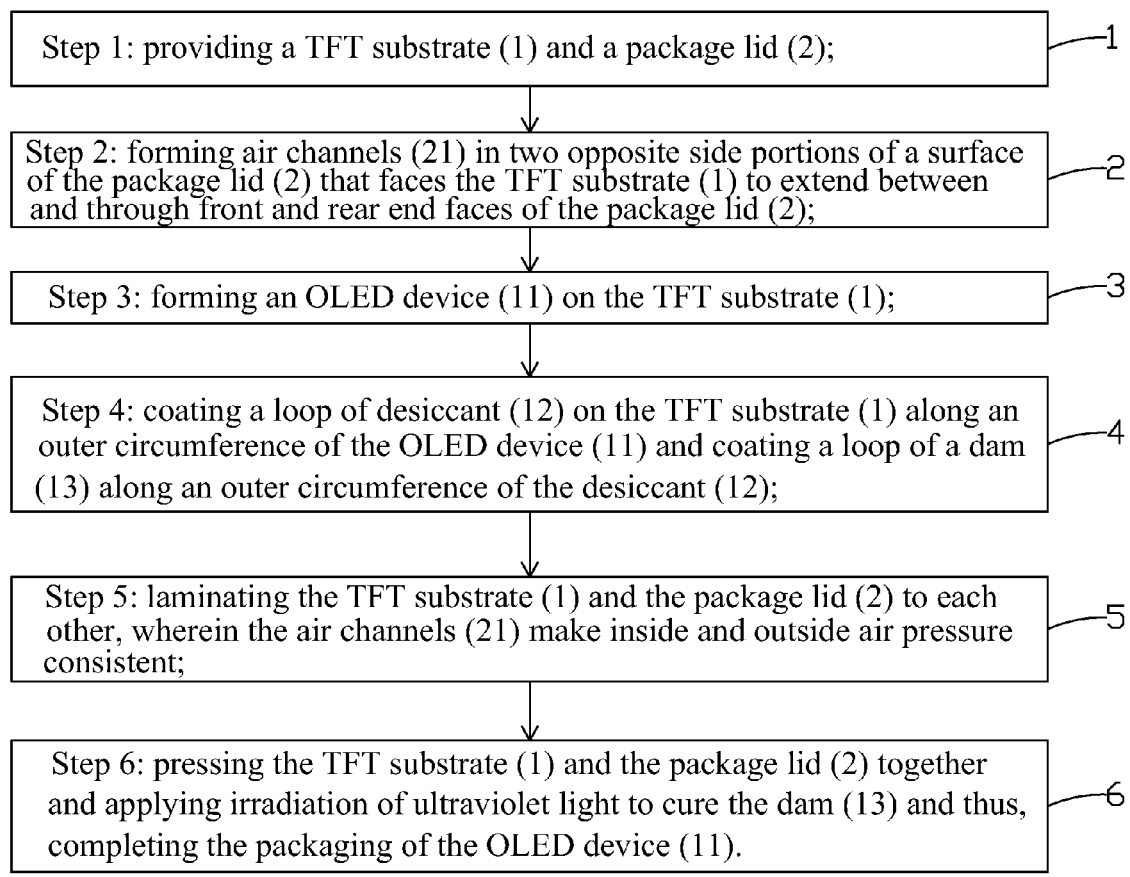
FIG. 2 is a flow chart illustrating an OLED packaging method according to the present invention.
Figure 3:
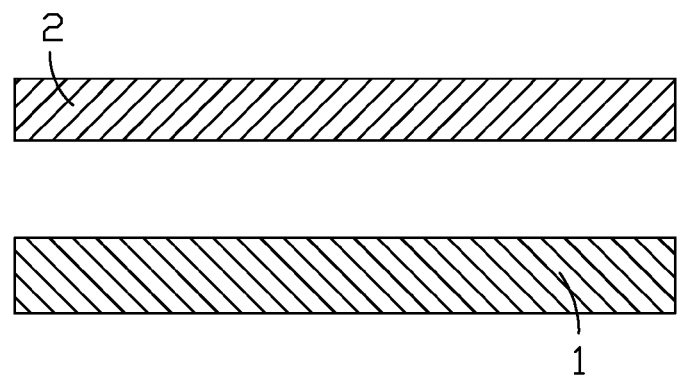
FIG. 3 is a schematic view illustrating a first step of the OLED packaging method according to the present invention.

Referring to FIG. 2, firstly, the present invention provides an organic light emitting diode (OLED) packaging method, which comprises the following steps:

Step 1: as shown in FIG. 3, providing a thin-film transistor (TFT) substrate 1 and a package lid 2.

Specifically, the TFT substrate 1 and the package lid 2 are both transparent and preferably, the TFT substrate 1 comprises a base material made of glass and the package lid 2 comprises a glass plate.

Figure 4:
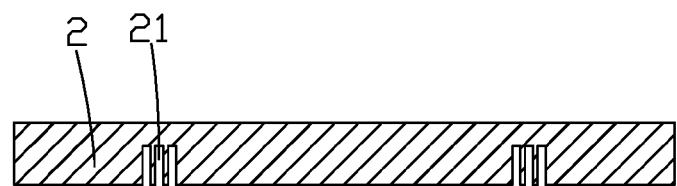
FIG. 4 is a cross-sectional view illustrating a package lid in a second step of the OLED packaging method according to the present invention.
Figure 5:
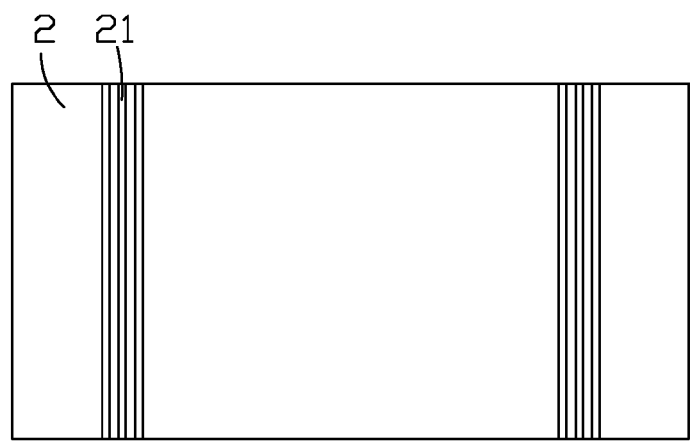
FIG. 5 is a bottom view illustrating the package lid in the second step of the OLED packaging method according to the present invention.

Step 2: as shown in FIGS. 4 and 5, forming air channels 21 in a two opposite side portions of a surface of the package lid 2 that faces the TFT substrate 1 to extend between and through front and rear end faces of the package lid 2.

Specifically, Step 2 uses an acidic corrosion or etching process to make the air channels 21.

The air channels 21 collectively form a cross-section of a corrugated configuration.

Figure 6:
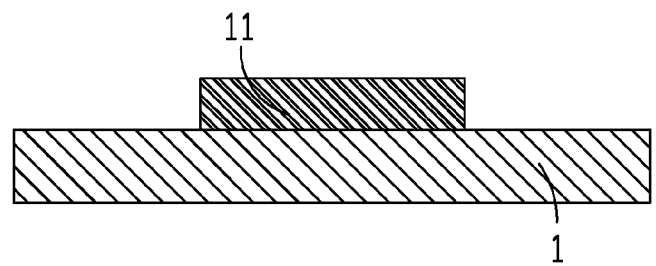
FIG. 6 is a schematic view illustrating a third step of the OLED packaging method according to the present invention.

Step 3: as shown in FIG. 6, forming an OLED device 11 on the TFT substrate 1 through a vapor deposition process.

Specifically, forming the OLED device 11 in Step 3 comprises, in sequence, forming an anode, an organic emissive layer, and a cathode on the TFT substrate 1.

Figure 7:
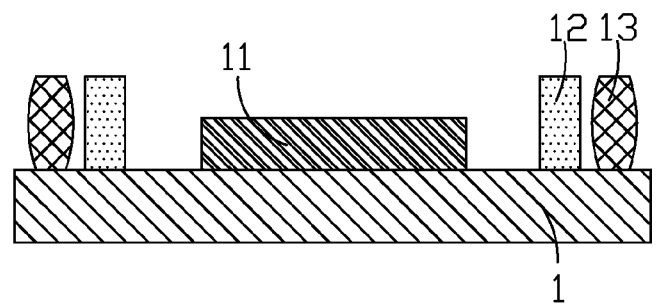
FIG. 7 is a schematic view illustrating a fourth step of the OLED packaging method according to the present invention.

Step 4: as shown in FIG. 7, coating a loop of desiccant 12 on the TFT substrate 1 along an outer circumference of the OLED device 11 and coating a loop of a dam 13 along an outer circumference of the desiccant 12.

Specifically, the desiccant 12 comprises liquid desiccant and the dam 13 is form of ultraviolet (UV) resin that is sensitive to ultraviolet light.

Figure 8:
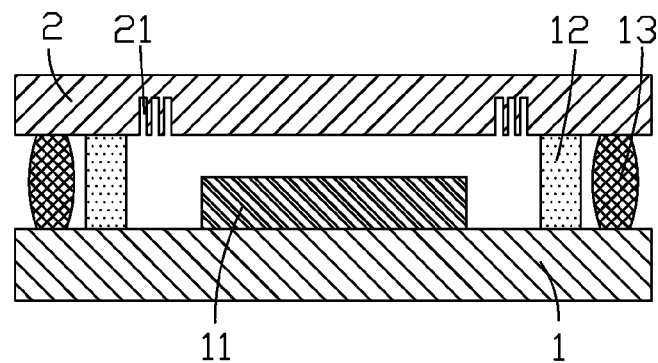
FIG. 8 is a cross-sectional view, taken along a section close to a middle of the package lid, illustrating a fifth step of the OLED packaging method according to the present invention.
Figure 9:
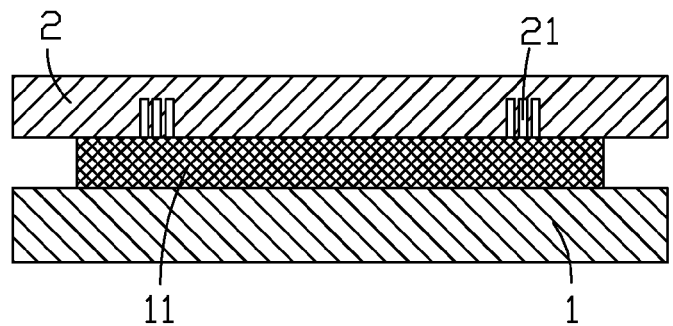
FIG. 9 is a cross-sectional view, taken along a section close to a front or rear end face of the package lid, illustrating the fifth step of the OLED packaging method according to the present invention.

Step 5: as shown in FIGS. 8 and 9, laminating the TFT substrate 1 and the package lid 2 to each other.

The surface of the package lid 2 that faces the TFT substrate 1 comprises the air channels 21 formed therein to extend between and through the front and rear end faces of the package lid 2, so that in the performance of Step 5 of laminating the TFT substrate 1 and the package lid 2 to each other, the air channels 21 are located at areas that are outside the area in which the OLED device 11 is located and the air channels 21 help make inside and outside pressures consistent with each other so as to effectively eliminate the issue of resin flushing caused by a difference of air pressure between the inside and outside.

Figure 10:
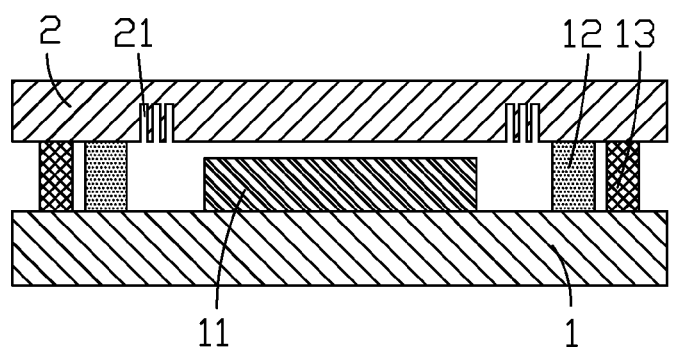
FIG. 10 is a cross-sectional view, taken along a section close to a middle of the package lid, illustrating a sixth step of the OLED packaging method according to the present invention and also shows a cross-sectional view of an OLED packaging structure according to the present invention taken along a section close to a middle of a package lid.
Figure 11:
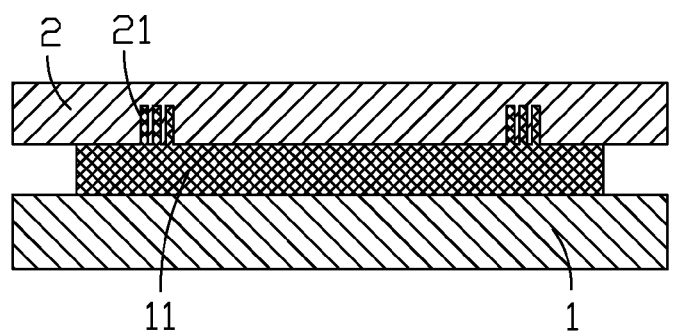
FIG. 11 is a cross-sectional view, taken along a section close to a front or rear end of the package lid, illustrating the sixth step of the OLED packaging method according to the present invention and also shows a cross-sectional view of an OLED packaging structure according to the present invention taken along a section close to a front or rear end face of a package lid.

Step 6: as shown in FIGS. 10 and 11, pressing the TFT substrate 1 and the package lid 2 together and applying irradiation of ultraviolet light to cure the dam 13 and thus, completing the packaging of the OLED device 11.

It is noted here that, as shown in FIG. 11, pressing the TFT substrate 1 and the package lid 2 together of Step 6 is carried out so that a height of the desiccant 12 is made smaller than or equal to a height of the dam 13 to make the dam 13 and the package lid 2 tightly engage each other and a portion of the dam 13 that is adjacent to each of the front end face and the rear end face of the package lid 2 is forced into the air channels 21 to increase a press-to-engage area between the dam 13 and the package lid 2 and thus improving sealing and water resistance property and enhancing the mechanical strength of bonding between the dam 13 and the package lid 2 so as to improve the packaging effectiveness.

The present invention also provides an OLED packaging structure. Referring to FIGS. 10 and 11, in combination with FIGS. 4 and 5, the OLED packaging structure comprises: a TFT substrate 1, a package lid 2 opposite to the TFT substrate 1, an OLED device 11 arranged between the TFT substrate 1 and the package lid 2 and mounted to the TFT substrate 1, a loop of desiccant 12 arranged along an outer circumference of the OLED device 11, and a loop of a dam 13 arranged along an outer circumference of the desiccant 12 and bonding the TFT substrate 1 and the package lid 2 to each other. The package lid 2 has a surface that faces the TFT substrate 1 and has two opposite side portions each comprising air channels 21 formed therein and extending between and through front and rear end faces of the package lid 2, wherein the air channels 21 are located in areas that are outside an area to which the OLED device 11 corresponds.

Specifically, the TFT substrate 1 and the package lid 2 are both transparent. Thus, the OLED packaging structure is applicable to a bottom emission OLED device and is also applicable to a top emission OLED device. Preferably, the TFT substrate 1 comprises a base material of glass and the package lid 2 comprises a glass plate.

The air channels 21 collectively form a cross section having a corrugated configuration.

The OLED device 11 comprises an anode, an organic emissive layer, and a cathode formed, in sequence, on the TFT substrate 1.

The desiccant 12 can be liquid desiccant and the dam 13 can be made of a UV resin that is sensitive to UV light. The desiccant 12 has a height that is smaller than or equal to a height of the dam 13.

The OLED packaging structure described above comprises the air channels 21 so as to effectively eliminate the issue of resin flushing caused by a difference between inside and outside air pressure in bonding the package lid 2 and the TFT substrate 1 to each other. In addition, a portion of the dam 13 that is adjacent to each of the front end face and the rear end face of the package lid 2 is forced into the air channels 21, so as to increase the press-to-engage area between the dam 13 and the package lid 2 and thus providing an improved property of water blocking and enhanced mechanical strength and thus bettered packaging effectiveness.

In summary, the present invention provides an OLED packaging method, which is easy to operate and which forms air channels in two side portions of a surface of a package lid that faces a TFT substrate to extend between and through front and rear end faces of the package lid to make inside and outside air pressure consistent with each other in bonding the TFT substrate and the package lid so as to effectively eliminate the issue of resin flushing caused by inconsistency of air pressures of the inside and outside in bonding the package lid and the TFT substrate. Further, after the TFT substrate and the package lid are pressed to bond to each other, a portion of the dam is forced into the air channels to increase the press-to-engage area between the dam and the package lid, enhance the properties of sealing and water resistance, increase the mechanical strength of bonding between the dam and the package, and improve the packaging effectiveness. The present invention provides an OLED packaging structure, which comprises air channels formed in two side portions of the surface of the package lid facing the TFT substrate to extend between and through the front and rear end faces of the package lid, so as to effectively eliminate the issue of resin flushing caused by inconsistency between inside and outside air pressures of the packaging structure in bonding the package lid and the TFT substrate to each other thereby providing an improved property of water resistance and also achieving improved mechanical strength and enhanced packaging effectiveness.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An organic light emitting diode (OLED) packaging method, comprising the following steps:
    (1) providing a thin-film transistor (TFT) substrate and a package lid;
    (2) forming air channels in two opposite side portions of a surface of the package lid that faces the TFT substrate to extend between and through front and rear end faces of the package lid;
    (3) forming an OLED device on the TFT substrate;
    (4) coating a loop of desiccant on the TFT substrate along an outer circumference of the OLED device and coating a loop of a dam along an outer circumference of the desiccant;

(5) laminating the TFT substrate and the package lid to each other to define therebetween an interior space in which the OLED device is arranged and enclosed by the TFT substrate and the package lid, wherein the air channels make inside and outside air pressure consistent; and (6) pressing the TFT substrate and the package lid together and applying irradiation of ultraviolet light to cure the dam and thus, completing the packaging of the OLED device;

wherein in Step (5), the air channels are in communication with the interior space defined between the TFT substrate and the package lid and are also in communication with an exterior space outside the TFT substrate and the package lid through openings of the air channels formed in the front and rear end faces of the package lid so as to make air pressure consistent between the interior space and the exterior space; and wherein the air channels are arranged such that a part of a material of the dam is allowed to get into a portion of the air channels that is adjacent to each of the front and rear end faces of the package lid when the TFT substrate and the package are pressed together in Step (6) so as to increase contact areas between the material of the dam and the package lid.

2. The OLED packaging method as claimed in claim 1, wherein the air channels formed in Step (2) have a cross-section in the form of a corrugated configuration.

3. The OLED packaging method as claimed in claim 1, wherein Step (2) uses an acidic corrosion process to form the air channels.

4. The OLED packaging method as claimed in claim 1, wherein Step (3) uses a vapor deposition process to form the OLED device.

5. The OLED packaging method as claimed in claim 1, wherein in Step (4), the desiccant comprises liquid desiccant.

6. The OLED packaging method as claimed in claim 1, wherein in Step (6), when the substrate and the package lid are pressed together, the desiccant has a height that is smaller than or equal to a height of the dam.

7. The OLED packaging method as claimed in claim 1, wherein the air channels are located in areas that are outside an area corresponding to the OLED device.

8. An organic light emitting diode (OLED) packaging structure, comprising: a thin-film transistor (TFT) substrate, a package lid opposite to the TFT substrate, an OLED device arranged between the TFT substrate and the package lid and mounted to the TFT substrate, a loop of desiccant formed along an outer circumference of the OLED device, and a loop of a dam formed along an outer circumference of the desiccant and bonding the TFT substrate and the package lid together;

wherein the package lid has a surface that faces the TFT substrate and has opposite side portions each comprising air channels formed therein and extending between and through front and rear end faces of the package lid, the air channels being located in areas that are outside an area corresponding to the OLED device; and wherein the air channels are arranged such that a part of a material of the dam is received into a portion of the air channels that is adjacent to each of the front and rear end faces of the package lid to increase contact areas between the material of the dam and the package lid and wherein before the part of the material of the dam is received into the portion of the air channels that is adjacent to each of the front end rear end faces of the package lid, the air channels are in communication with an interior space defined between the TFT substrate and the package lid and is also in communication an exterior space outside the TFT substrate and the package through openings of the air channels formed in the front and rear end faces of the package lid so as to make air pressure consistent between the interior space and the exterior space.

9. The OLED packaging structure as claimed in claim 8, wherein the air channels have a cross section in the form of a corrugated configuration.

10. The OLED packaging structure as claimed in claim 8, wherein the desiccant comprises liquid desiccant and the desiccant has a height smaller than or equal to a height of the dam.

11. An organic light emitting diode (OLED) packaging structure, comprising: a thin-film transistor (TFT) substrate, a package lid opposite to the TFT substrate, an OLED device arranged between the TFT substrate and the package lid and mounted to the TFT substrate, a loop of desiccant formed along an outer circumference of the OLED device, and a loop of a dam formed along an outer circumference of the desiccant and bonding the TFT substrate and the package lid together;

wherein the package lid has a surface that faces the TFT substrate and has opposite side portions each comprising air channels formed therein and extending between and through front and rear end faces of the package lid, the air channels being located in areas that are outside an area corresponding to the OLED device;

wherein the air channels are arranged such that a part of a material of the dam is received into a portion of the air channels that is adjacent to each of the front and rear end faces of the package lid to increase contact areas between the material of the dam and the package lid and wherein before the part of the material of the dam is received into the portion of the air channels that is adjacent to each of the front end rear end faces of the package lid, the air channels are in communication with an interior space defined between the TFT substrate and the package lid and is also in communication an exterior space outside the TFT substrate and the package through openings of the air channels formed in the front and rear end faces of the package lid so as to make air pressure consistent between the interior space and the exterior space;

wherein the air channels have a cross section in the form of a corrugated configuration; and wherein the desiccant comprises liquid desiccant and the desiccant has a height smaller than or equal to a height of the dam.

* * * * *